United States Patent
Yueh et al.

(10) Patent No.: US 10,854,706 B2
(45) Date of Patent: Dec. 1, 2020

(54) TILED ELECTRONIC SYSTEM AND TILED ELECTRONIC UNIT

(71) Applicant: InnoLux Corporation, Miao-Li County (TW)

(72) Inventors: Jui-Jen Yueh, Miao-Li County (TW); Kuan-Feng Lee, Miao-Li County (TW); Yuan-Lin Wu, Miao-Li County (TW)

(73) Assignee: Innolux Corporation, Chu-Nan (TW)

( * ) Notice: Subject to any disclaimer, the term of this patent is extended or adjusted under 35 U.S.C. 154(b) by 11 days.

(21) Appl. No.: 16/127,947

(22) Filed: Sep. 11, 2018

(65) Prior Publication Data
US 2020/0083315 A1 Mar. 12, 2020

(51) Int. Cl.
*G06F 3/041* (2006.01)
*H01L 27/32* (2006.01)
*H01L 51/52* (2006.01)

(52) U.S. Cl.
CPC ........ *H01L 27/3293* (2013.01); *G06F 3/0412* (2013.01); *H01L 27/3255* (2013.01); *H01L 51/529* (2013.01)

(58) Field of Classification Search
CPC .............. G06F 3/0412; H01L 27/3293; H01L 27/3255; H01L 51/529
See application file for complete search history.

(56) References Cited

U.S. PATENT DOCUMENTS

| | | | |
|---|---|---|---|
| 2015/0062066 A1* | 3/2015 | Shih | G06F 3/044 345/174 |
| 2017/0017453 A1 | 1/2017 | Hoshino et al. | |
| 2017/0025593 A1 | 1/2017 | Bower et al. | |
| 2017/0047393 A1* | 2/2017 | Bower | G06F 3/044 |
| 2017/0080606 A1 | 3/2017 | Kim et al. | |
| 2017/0140679 A1* | 5/2017 | Tomoda | G09F 9/3026 |
| 2017/0236866 A1 | 8/2017 | Lee et al. | |

FOREIGN PATENT DOCUMENTS

WO 2017154400 A 9/2017

* cited by examiner

*Primary Examiner* — Towfiq Elahi
(74) *Attorney, Agent, or Firm* — Muncy, Geissler, Olds & Lowe, P.C.

(57) ABSTRACT

A tiled electronic system is disclosed, which includes: a plurality of electronic units including a first electronic unit and a second electronic unit, wherein the second electronic unit is separated from the first electronic unit by a distance in a first direction, wherein the distance is conformed to the following equation (I):

$$d \geq 8.75 \times 10^{-5} \times W1 \times \sqrt{\frac{W1^2}{(W1^2 + W2^2)}} \quad (I)$$

wherein d is the distance, W1 is a width of the first electronic unit in the first direction, and W2 is a width of the first electronic unit in a second direction perpendicular to the first direction.

18 Claims, 7 Drawing Sheets

TILED ELECTRONIC SYSTEM AND TILED ELECTRONIC UNIT

BACKGROUND

1. Field

The present disclosure relates to a tiled electronic system and a tiled electronic unit. More specifically, the present disclosure relates to a tiled electronic system and a tiled electronic unit in which the damage problem caused by thermal expansion can be improved.

2. Description of Related Art

With the continuous advancement of technologies related to display units, the applications of the display units are not limited to monitors, mobile phones, laptops, televisions, etc. Nowadays, tiled display systems are developed to extend the applications of the display units to video walls, advertising boards, and other electronic units for displaying large images.

Except for the tiled display system, tiled antenna systems or tiled sensing systems are also developed to make, for example, the walls of buildings, have antenna or sensing functions.

To achieve the purpose of attractive appearance, two adjacent electronic units in the tiled electronic systems (such as the tiled display systems, the tiled antenna systems or the tiled sensing systems) have to be arranged close to each other. However, if two adjacent electronic units are too close, the tiled electronic systems may be damaged because of the thermal expansion.

Therefore, it is desirable to provide a tiled electronic system or a tiled electronic unit in which the damage problem caused by thermal expansion can be improved.

SUMMARY

The present disclosure provides a tiled electronic system, which comprises: a plurality of electronic units comprising a first electronic unit and a second electronic unit, wherein the second electronic unit is separated from the first electronic unit by a distance in a first direction. The distance is conformed to the following equation (I):

$$d \geq 8.75 \times 10^{-5} \times W1 \times \sqrt{\frac{W1^2}{(W1^2 + W2^2)}} \quad (I)$$

wherein d is the distance, W1 is a width of the first electronic unit in the first direction, and W2 is a width of the first electronic unit in a second direction perpendicular to the first direction.

The present disclosure also provides a tiled electronic unit, which comprise: a driving substrate; and a plurality of electronic panels disposed on the driving substrate and comprising a first electronic panel and a second electronic panel, wherein the second electronic panel is separated from the first electronic panel by a distance in a first direction. The distance is conformed to the following equation (I):

$$d \geq 8.75 \times 10^{-5} \times W1 \times \sqrt{\frac{W1^2}{(W1^2 + W2^2)}} \quad (I)$$

wherein d is the distance, W1 is a width of the first electronic panel in the first direction, and W2 is a width of the first electronic panel in a second direction perpendicular to the first direction.

Other novel features of the disclosure will become more apparent from the following detailed description when taken in conjunction with the accompanying drawings.

DETAILED DESCRIPTION OF EMBODIMENT

Figure 1A:
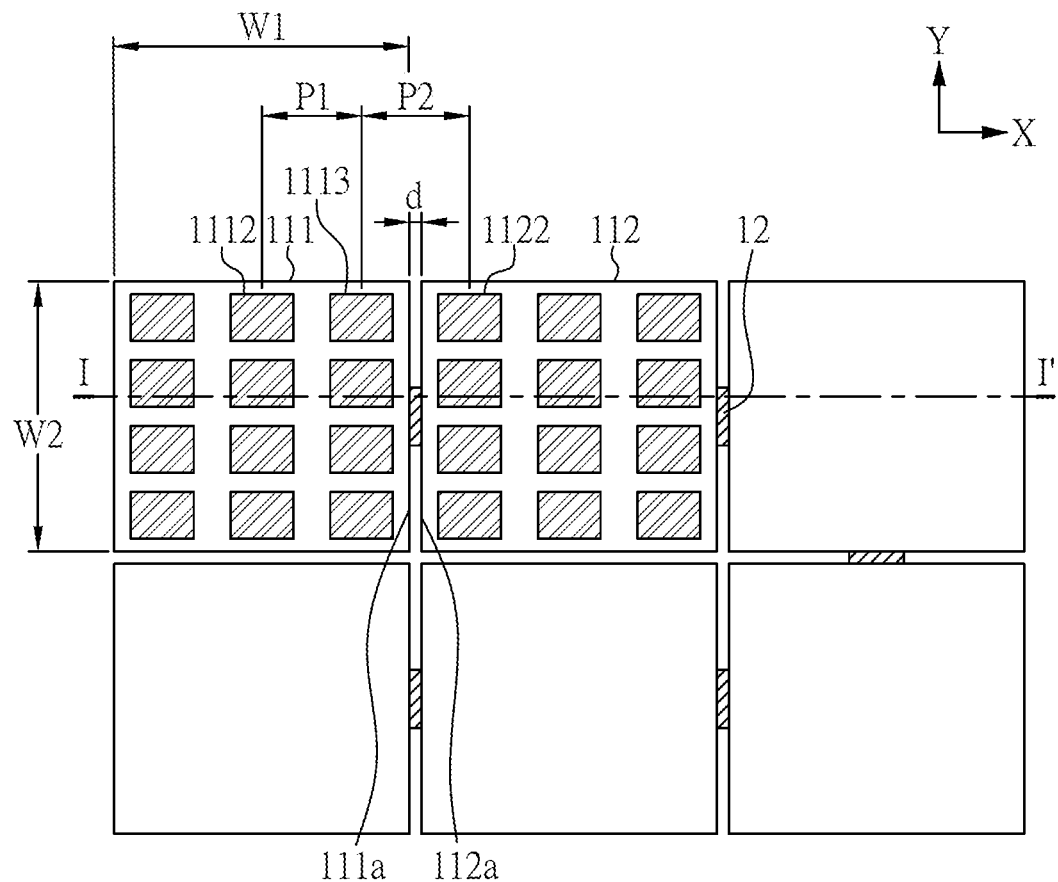
FIG. 1A and FIG. 1B are respectively a perspective view and a cross-sectional view of a tiled electronic system according to Embodiment 1 of the present disclosure.

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Furthermore, the terms recited in the specification and the claims such as "connect" is intended not only directly connect with other element, but also intended indirectly connect and electrically connect with other element.

Furthermore, when a value is in a range from a first value to a second value, the value can be the first value, the second value, or another value between the first value and the second value.

In addition, the features in different embodiments of the present disclosure can be mixed to form another embodiment.

It should be noted that, in the following embodiments, not all the active elements comprised in electronic units are shown in the drawings.

Embodiment 1

Figure 1B:
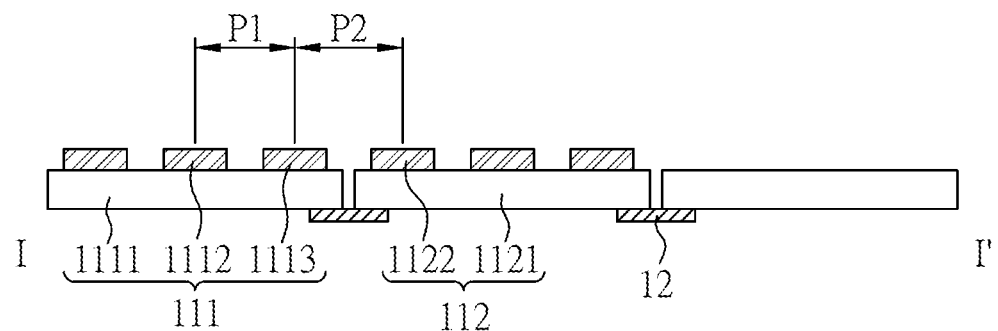

FIG. 1A is a perspective view of a tiled electronic system of the present embodiment, and FIG. 1B is a cross-sectional view taken along the line I-I' indicated in FIG. 1A.

The tiled electronic system of the present embodiment comprises: a plurality of electronic units comprising a first electronic unit 111 and a second electronic unit 112. In the present embodiment, the tiled electronic system comprises six electronic units arranged in a 3×2 array. However, the number and the arrangement of the electronic units are not limited thereto, and can be adjusted according to the actual requirement.

Herein, each of the electronic units including the first electronic unit 111 and the second electronic unit 112 is an electronic device, and all the electronic devices constitute the tiled electronic system. The first electronic unit 111 comprises a driving substrate 1111 and a plurality of active elements (including the first active element 1112 and the second active element 1113) disposed on the driving substrate 1111, and the driving substrate 1111 drives the active elements disposed thereon. Similarly, the second electronic unit 112 also comprises a driving substrate 1121 and a plurality of active elements (including the third active element 1122) disposed on the driving substrate 1121, and the driving substrate 1121 drives the active elements disposed thereon. In one aspect of the present disclosure, the driving substrate 1111 and the driving substrate 1121 may each comprises a substrate and circuits disposed on the substrate, and the substrate can be a quartz substrate, a glass substrate, a wafer, a sapphire substrate, or etc. In another aspect of the present disclosure, the substrate can be a flexible substrate or a film, and the material of which can comprise polycarbonate (PC), polyimide (PI), polypropylene (PP), polyethylene terephthalate (PET), or other plastic or polymer material.

The structures of the other four electronic units are similar to those of the first electronic unit 111 and the second electronic unit 112, and thus a detailed description therefor is deemed unnecessary.

In the present embodiment, the first electronic unit 111 and the second electronic unit 112 are electrically connected to each other in a cascading manner. In addition, the first electronic unit 111 and the second electronic unit 112 are electrically connected to each other in a wired manner. For example, in the present embodiment, the first electronic unit 111 and the second electronic unit 112 are electrically connected to each other via connectors 12 (for example, circuit boards). However, the present disclosure is not limited thereto. In another embodiment of the present disclosure, the electronic units comprising the first electronic unit 111 and the second electronic unit 112 may not be electrically connected to each other.

In the present embodiment, the first electronic unit 111 and the second electronic unit 112 are arranged in juxtaposition. In order to obtain a narrow-seam tiled electronic system, two adjacent electronic units have to be arranged close to each other to reduce the gap between two adjacent electronic units. However, if two adjacent electronic units are too close, the tiled electronic system may be damaged (for example, the tiled electronic system may be cracked) when the electronic units are expanded due to the thermal expansion caused by the environmental heat or the heat generated during the operation of the tiled electronic system. Thus, the gap between two adjacent electronic units has to be designed to prevent the problem mentioned above.

Herein, the gap between two adjacent electronic units is designed based on the material of the substrates, the coefficient of linear thermal expansion of the substrates, and the rising temperature predetermined by the designer according to the environmental heat and/or the heat generated during the operation of the tiled electronic system to obtain the following equations (I) to (III).

Hereinafter, the first electronic unit 111 and the second electronic unit 112 adjacent to the first electronic unit 111 are used to explain the design of the gap between two adjacent electronic units in the tiled electronic system of the present embodiment.

In the present embodiment, the second electronic unit 112 is separated from the first electronic unit 111 by a distance (i.e. the gap between the first electronic unit 111 and the second electronic unit 112) in a first direction X, and the distance d is conformed to the following equation (I):

$$d \geq 8.75 \times 10^{-5} \times W1 \times \sqrt{\frac{W1^2}{(W1^2 + W2^2)}} \quad (I)$$

In another embodiment of the present disclosure, the distance (i.e. the gap between the first electronic unit 111 and the second electronic unit 112) is further conformed to the following equation (II):

$$d \geq 1.58 \times 10^{-4} \times W1 \times \sqrt{\frac{W1^2}{(W1^2 + W2^2)}} \quad (II)$$

In further another embodiment of the present disclosure, the distance (i.e. the gap between the first electronic unit 111 and the second electronic unit 112) is further conformed to the following equation (III):

$$d \geq 5.95 \times 10^{-4} \times W1 \times \sqrt{\frac{W1^2}{(W1^2 + W2^2)}} \quad (III)$$

In the above equations (I) to (III), d is the distance, W1 is a width of the first electronic unit 111 in the first direction X, and W2 is a width of the first electronic unit 111 in a second direction Y perpendicular to the first direction X. Herein, the distance d, the width W1, and the width W2 have the same unit.

If the distance d (i.e. the gap between the first electronic unit 111 and the second electronic unit 112) in the first direction X is less than the lower limit defined in the aforesaid equation (I), (II) or (III), the tiled electronic system may be easily damaged or cracked when the electronic units are expanded due to the thermal expansion caused by the environmental heat or the heat generated during the operation of the tiled electronic system.

Herein, the distance d between the first electronic unit 111 and the second electronic unit 112 and the width W1 and the width W2 of the first electronic unit 111 are measured when the tiled electronic system is in a turn-off state and at 25° C.

In the present embodiment, which one of the aforesaid equations (I), (II) and (III) is selected to design the distance d of the gap between the first electronic unit 111 and the second electronic unit 112 can be determined according to the material of the substrate comprised in the first electronic unit 111 and the second electronic unit 112.

If the driving substrates 1111, 1121 respectively comprise a plastic substrate, the equation (III) can be selected to design the distance d of the gap between the first electronic unit 111 and the second electronic unit 112. If the driving substrates 1111, 1121 comprise glass substrates, the equation (II) can be selected to design the distance d of the gap between the first electronic unit 111 and the second electronic unit 112. If the driving substrates 1111, 1121 respectively comprise a sapphire substrate, a silicon carbide (SiC) substrate or a silicon wafer, the equation (I) can be selected to design the distance d of the gap between the first electronic unit 111 and the second electronic unit 112.

Herein, the term "first direction" is an arrangement direction of the first electronic unit 111 and the second electronic unit 112. As shown in FIG. 1A, the second electronic unit 112 is disposed on the right side of the first electronic unit 111, so the first direction refers to the horizontal direction. If the distance of the gap between the first electronic unit 111 and another electronic unit disposed below the first electronic unit 111 is going to be designed, the first direction refers to the vertical direction.

For example, the width W1 of the first electronic unit 111 is 200 mm, and the width W2 of the second electronic unit 112 is 100 mm. If the driving substrates 1111, 1121 comprise silicon wafers, the distance d is designed to be greater than 0.016 mm according to the equation (I). In another example, if the driving substrates 1111, 1121 comprise glass substrates, the distance d is designed to be greater than 0.028 mm according to the equation (II). In further another example, if the driving substrates 1111, 1121 comprise plastic substrates, the distance d is designed to be greater than 0.106 mm according to the equation (III).

Furthermore, in the tiled electronic system of the present embodiment, each of the electronic units comprises a plurality of active elements. As mentioned above, the electronic units may be expanded due to the thermal expansion caused by the environmental heat or the heat generated during the operation of the tiled electronic system. In order to keep the intervals between adjacent active elements not differed too much, the distance between two adjacent active elements disposed in one electronic unit and the distance between two adjacent active elements respectively disposed in two adjacent electronic units have also to be designed.

Hereinafter, the first electronic unit 111 and the second electronic unit 112 adjacent to the first electronic unit 111 are used to explain the design of the intervals between adjacent active elements.

In the present embodiment, the first electronic unit 111 comprises a first active element 1112 and a second active element 1113 adjacent to the first active element 1112, and the second electronic unit 112 comprises a third active element 1122. The first active element 1112, the second active element 1113 and the third active element 1122 are arranged along the first direction X. The second active element 1113 is disposed adjacent to a first edge 111a of the first electronic unit 111, the third active element 1122 is disposed adjacent to the second edge 112a of the second electronic unit 112, and the first edge 111a is adjacent to the second edge 112a. A first distance P1 is between the first active element 1112 and the second active element 1113, a second distance P2 is between the second active element 1113 and the third active element 1122, and the first distance P1 is less than the second distance P2 when the tiled electronic system is in a turn-off state and at 25° C.

When the first distance P1 is designed to be less than the second distance P2 when the tiled electronic system is in a turn-off state and at 25° C., the distance between the first active element 1112 and the second active element 1113 may be substantially equal to the distance between the second active element 1113 and the third active element 1122 when the first electronic unit 111 and the second electronic unit 112 are expanded due to the rising temperature caused by the environmental heat and/or the heat generated during the operation of the tiled electronic system. In one embodiment of the present disclosure, a difference between the first distance P1 and the second distance P2 is d as defined in the equation (I), (II) or (III) or less.

In the present embodiment, the electronic units comprising the first electronic unit 111 and the second electronic unit 112 can respectively be a display device, a touch device, an antenna device or a sensing device. Thus, the tiled electronic system of the present embodiment may be a tiled display system, a tiled touch system, a tiled antenna system, a tiled sensing system (for example, a tiled sensing system for sensing photo signals, capacitance or temperature) or a combination thereof (for example, a tiled electronic system comprising at least two functions of display, touch, sensing, and receiving or transmitting radio wave).

In the following Embodiment 2, a tiled display system is illustrated.

Embodiment 2

Figure 2A:
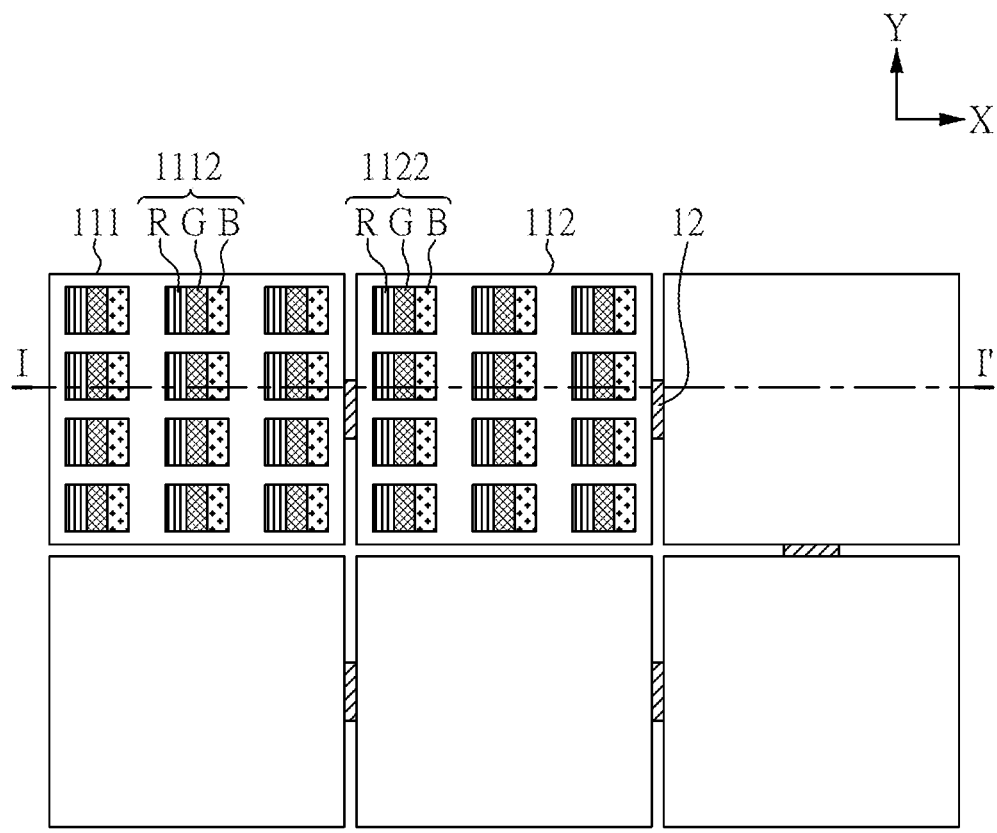
FIG. 2A and FIG. 2B are respectively a perspective view and a cross-sectional view of a tiled electronic system according to Embodiment 2 of the present disclosure.
Figure 2B:
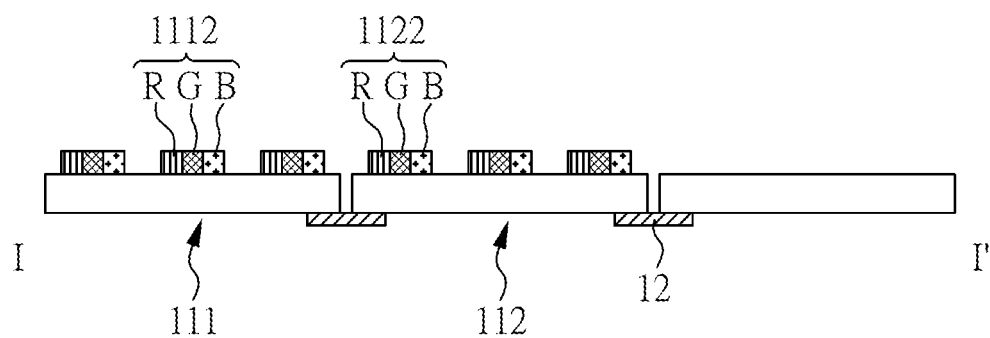

FIG. 2A is a perspective view of a tiled electronic system of the present embodiment, and FIG. 2B is a cross-sectional view taken along the line I-I' indicated in FIG. 2A. The tiled electronic system of the present embodiment is similar to that of Embodiment 1, except that the tiled electronic system of the present embodiment is specifically a tiled display system.

In the present embodiment, the first electronic unit 111 and the second electronic unit 112 are respectively a display device. Thus, the active elements, for example the first active element 1112 of the first electronic unit 111 and the third active element 1122 of the second electronic unit 112 are pixels of the display device.

More specifically, the active elements such as the first active element 1112 and the third active element 1122 are pixels, and each pixel comprises a red sub-pixel R, a green sub-pixel G and a blue sub-pixel B. However, the present disclosure is not limited thereto. In another embodiment of the present disclosure, each pixel may comprise a red sub-pixel, a green sub-pixel, a blue sub-pixel and a white sub-pixel. In further another embodiment of the present disclosure, each pixel may comprise a red sub-pixel, a green sub-pixel, a blue sub-pixel and a yellow sub-pixel.

In the present embodiment, the first electronic unit 111 and the second electronic unit 112 may further comprise liquid crystals (LCs), quantum dots (QDs), fluorescence molecules, phosphors, organic light-emitting diodes (OLEDs), inorganic light-emitting diodes (LEDs), mini light-emitting diodes (mini-LEDs), micro light-emitting diodes (micro-LEDs), or quantum-dot light-emitting diodes (QLEDs). It could be understood that the chip size of the LED can be 300 μm to 10 mm, the chip size of the mini-LED can be 100 μm to 300 μm, and the chip size of the micro-LED can be 1 μm to 100 μm. But the present disclosure is not limited thereto.

When the first electronic unit 111 and the second electronic unit 112 comprise LEDs, mini-LEDs, micro-LEDs or QLEDs, the active elements such as the first active element 1112 and the third active element 1122 may be the pixels as illustrated above or the pixels shown in FIG. 3A to FIG. 3C. Furthermore, the pixels are corresponding to the LEDs, the mini-LEDs, the micro-LEDs or the QLEDs.

Figure 3A:
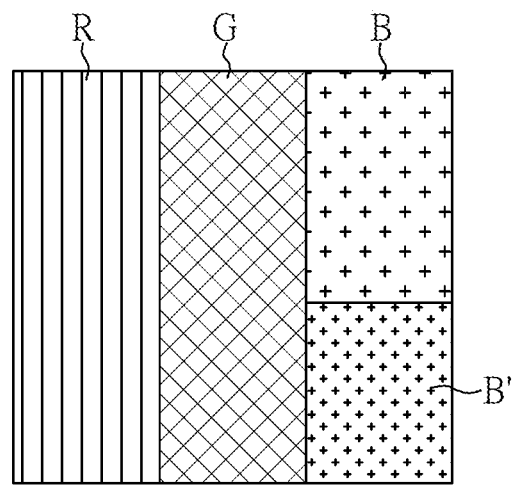
FIG. 3A to FIG. 3C are perspective view showing one pixel according to different aspects of the present disclosure.
Figure 3B:
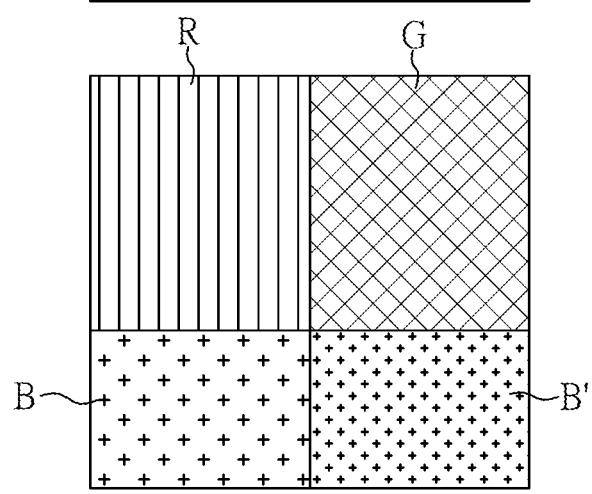
Figure 3C:
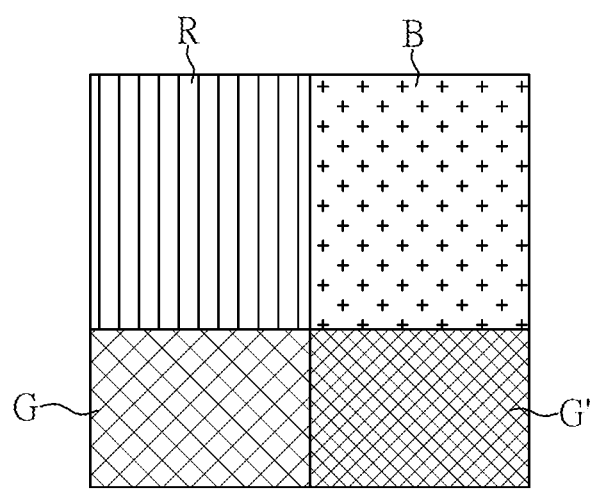

FIG. 3A to FIG. 3C are perspective view showing one pixel according to different aspects of the present disclosure. As shown in FIG. 3A and FIG. 3B, the pixel may comprise a red sub-pixel R, a green sub-pixel G, a first blue sub-pixel B and a second blue sub-pixel B', wherein a peak emission wavelength of the first blue sub-pixel B is slightly different from a peak emission wavelength of the second blue sub-pixel B'. For example, a difference between the peak emission wavelength of the first blue sub-pixel B and the peak emission wavelength of the second blue sub-pixel B' may be 5 to 15 nm. As shown in FIG. 3C, the pixel may comprise a red sub-pixel R, a first green sub-pixel G, a second green sub-pixel G' and a blue sub-pixel B, wherein a peak emission wavelength of the first green sub-pixel G is slightly different from a peak emission wavelength of the second green sub-pixel G'. For example, a difference between the peak emission wavelength of the first green sub-pixel G and the peak emission wavelength of the second green sub-pixel G' may be 5 to 15 nm.

The arrangements of the sub-pixels shown in FIG. 2A to FIG. 3C are not intended to limit the present disclosure, and can be adjusted according to the product requirement.

In another embodiment of the present disclosure, the first electronic unit 111 and the second electronic unit 112 can respectively be a touch display device.

Embodiment 3

Figure 4A:
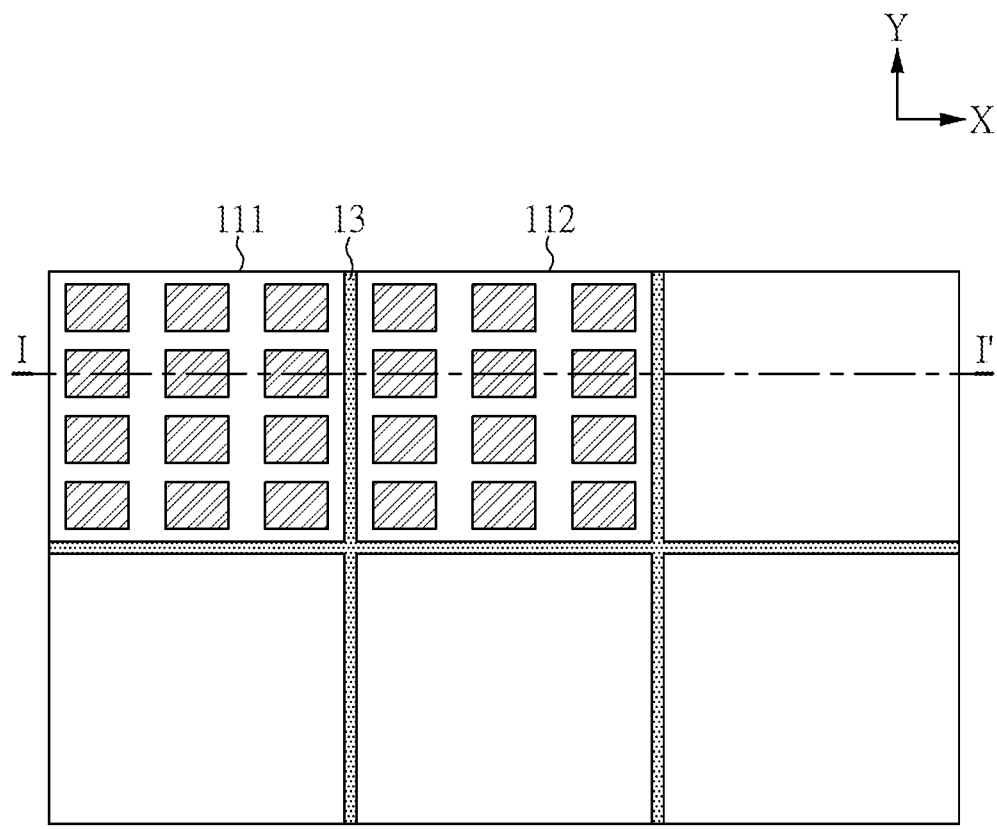
FIG. 4A and FIG. 4B are respectively a perspective view and a cross-sectional view of a tiled electronic system according to Embodiment 3 of the present disclosure.
Figure 4B:
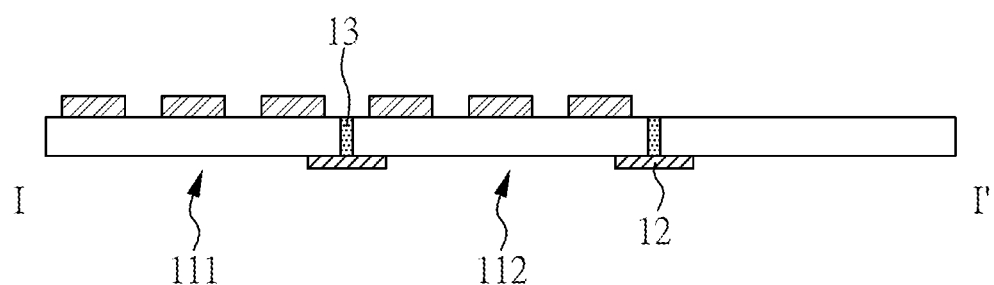

FIG. 4A is a perspective view of a tiled electronic system of the present embodiment, and FIG. 4B is a cross-sectional view taken along the line I-I' indicated in FIG. 4A. The tiled electronic system of the present embodiment is similar to that of Embodiment 1, except that the tiled electronic system of the present embodiment further comprises an intermediate element disposed between two adjacent electronic units.

More specifically, as shown in FIG. 4A and FIG. 4B, the tiled electronic system of the present embodiment further comprises an intermediate element 13 disposed between two adjacent electronic units, for example, between the first electronic unit 111 and the second electronic unit 112. The intermediate element 13 can be used as an adhesion layer to adhere two adjacent electronic units, or can be used as a buffer layer to absorb the impact resulting from the thermal expansion of the electronic units.

Herein, a young's modulus of the intermediate element 13 is less than a young's modulus of the electronic units including the first electronic unit 111 and the second electronic unit 112. More specifically, the young's modulus of the electronic unit is defined by the young's modulus of the substrate of the electronic unit. The intermediate element 13 may comprise a rubber (for example, a rubber with small strain), a polymer (for example, low density polyethylene, polypropylene, polyethylene terephthalate, polystyrene, or nylon), a rein, a photoresist or an oak (for example, oak with a rough surface). However, the present disclosure is not limited thereto.

In addition, the intermediate element 13 may comprise a light absorbing material. For example, the intermediate element 13 may be a black intermediate element.

In the above Embodiments 1 to 3, each of the electronic units is an individual electronic device, and all the electronic units constitute a tiled electronic system. In the following Embodiments 4 and 5, each of the electronic panels is an individual electronic panel or an individual electronic element, and all the electronic panels or the individual elements constitute a tiled electronic unit.

Embodiment 4

Figure 5A:
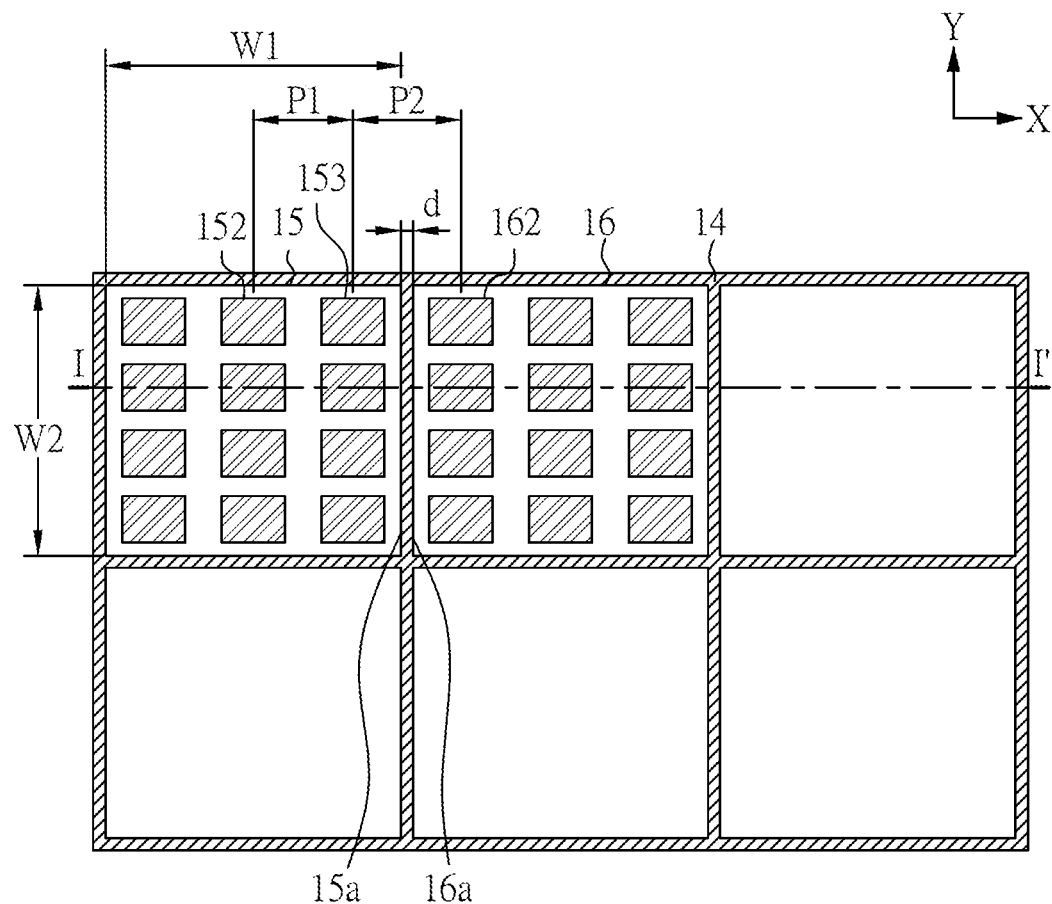
FIG. 5A and FIG. 5B are respectively a perspective view and a cross-sectional view of a tiled electronic unit according to Embodiment 4 of the present disclosure.
Figure 5B:
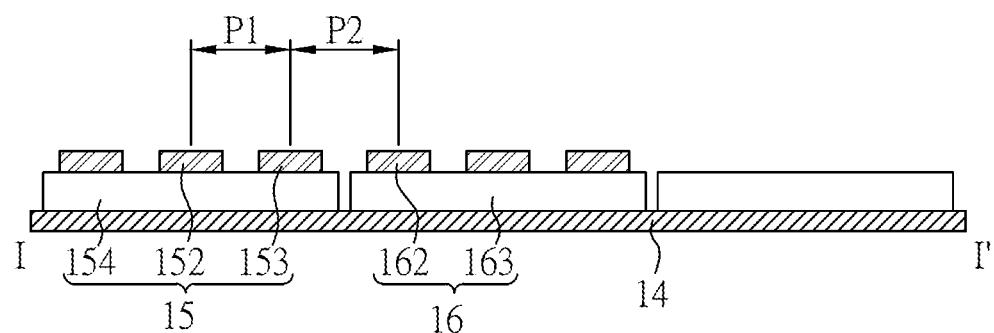

FIG. 5A is a perspective view of a tiled electronic unit of the present embodiment, and FIG. 5B is a cross-sectional view taken along the line I-I' indicated in FIG. 5A.

The features of the tiled electronic unit of the present embodiment are similar to the features of the tiled electronic system of Embodiment 1, except for the following differences.

In the present embodiment, each of the electronic panels including the first electronic panel 15 and the second electronic panel 16 is an electronic panel or an electronic element, and all the electronic panels or all the electronic elements constitute the tiled electronic unit. The tiled electronic unit comprises: a driving substrate 14, wherein the electronic panels (including the first electronic panel 15 and the second electronic panel 16) are disposed on the driving substrate 14 and electrically connected to the driving substrate 14, and the electronic panels (including the first electronic panel 15 and the second electronic panel 16) are electrically connected to each other via the driving substrate 14. In one aspect of the present disclosure, the driving substrate 14 can comprise a base substrate and circuits disposed on the base substrate, and the base substrate can be a glass substrate, a quartz substrate, or etc. In another aspect of the present disclosure, the base substrate can be a flexible substrate or a film, and the material of which can comprise PC, PI, PP, PET, or other plastic or polymer material. The first electronic panel 15 comprises a substrate 154 and a plurality of active elements (including the first active element 152 and the second active element 153) disposed on the substrate 154. Similarly, the second electronic panel 16 also comprises a substrate 163 and a plurality of active elements (including the third active element 162) disposed on the substrate 163. In one aspect of the present disclosure, the substrate 154 and the substrate 163 can respectively be a silicon wafer or a sapphire substrate, and circuits may be selectively formed on the substrate 154 or the substrate 163.

In the present embodiment, the first electronic panel 15 is separated from the second electronic panel 16 by a distance (i.e. the gap between the first electronic unit 111 and the second electronic unit 112) in a first direction X, and the distance d is conformed to the above mentioned equation (I). In another embodiment, the distance is further conformed to the above mentioned equation (II). In further another embodiment, the distance is further conformed to the above mentioned equation (III).

Herein, in the above mentioned equation (I) to (III), W1 is a width of the first electronic panel in the first direction, and W2 is a width of the first electronic panel in a second direction perpendicular to the first direction Herein, the distance d between the first electronic panel 15 and the second electronic panel 16 and the width W1 and the width W2 of the first electronic panel 15 are measured when the tiled electronic unit is in a turn-off state and at 25° C.

In the present embodiment, which one of the aforesaid equations (I), (II) and (III) is selected to design the distance d of the gap between the first electronic panel 15 and the second electronic panel 16 can be determined according to the material of the substrates 154, 163 comprised in the first electronic panel 15 and the second electronic panel 16.

In the present embodiment, the first active element 152, the second active element 153 and the third active element 162 are arranged along the first direction X, the second active element 153 is disposed adjacent to a first edge 15a of the first electronic panel 15, the third active element 162 is disposed adjacent to the second edge 16a of the second electronic panel 16, and the first edge 15a is adjacent to the second edge 16a. Herein, a first distance P1 between the first active element 152 and the second active element 153 is less than a second distance P2 between the second active element 153 and the third active element 162. In the present embodiment, a difference between the first distance P1 and the second distance P2 is d as defined in the equation (I), (II) or (III) or less.

In the present embodiment, the first electronic panel 15 and the second electronic panel 16 can respectively a display panel, an antenna element or a sensing element. Thus, the tiled electronic unit of the present embodiment may be a tiled display unit, a tiled antenna unit, a tiled sensing unit (for example, a tiled sensing unit for sensing photo signals, capacitance or temperature) or a combination thereof (for example, a tiled electronic unit comprising at least two functions of display, touch, sensing, and receiving or transmitting radio wave).

Embodiment 5

Figure 6A:
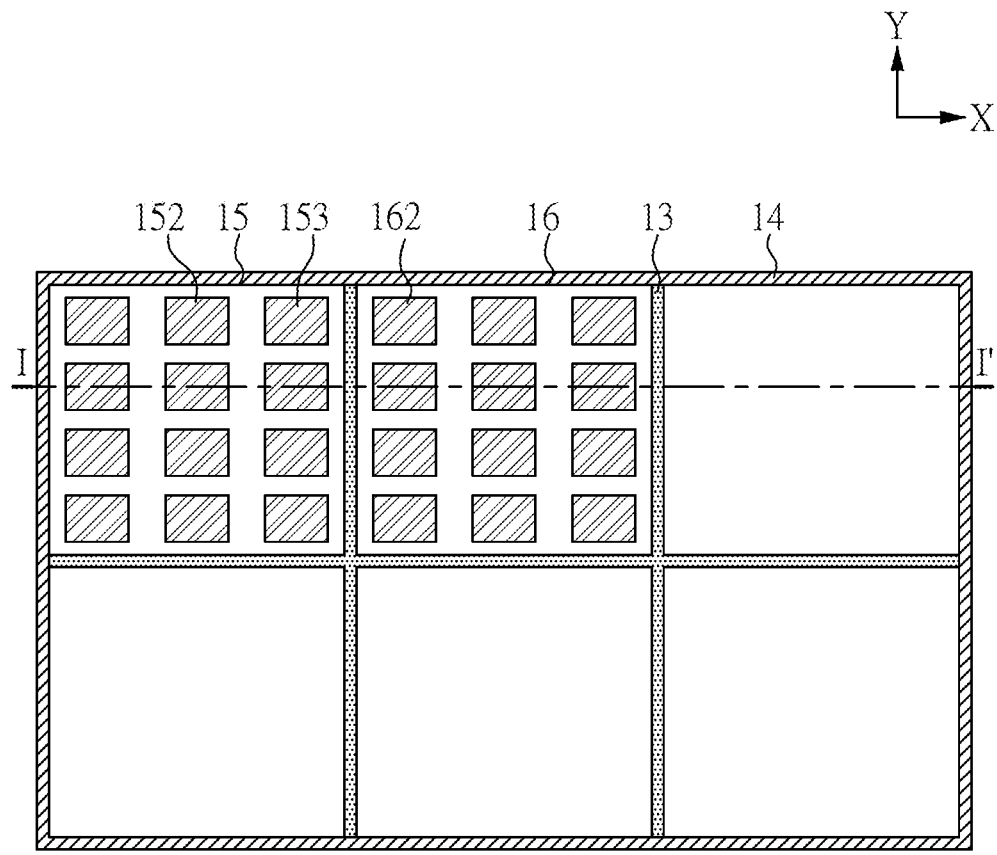
FIG. 6A and FIG. 6B are respectively a perspective view and a cross-sectional view of a tiled electronic unit according to Embodiment 5 of the present disclosure.
Figure 6B:
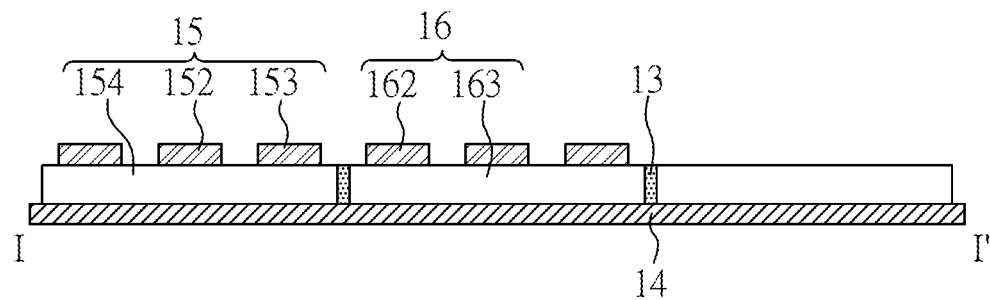

FIG. 6A is a perspective view of a tiled electronic unit of the present embodiment, and FIG. 6B is a cross-sectional view taken along the line I-I' indicated in FIG. 6A. The tiled electronic unit of the present embodiment is similar to that of Embodiment 4, except that the tiled electronic unit of the present embodiment further comprises an intermediate element disposed between two adjacent electronic panels.

The intermediate element 13 comprised in the tiled electronic unit of the present embodiment is similar to the intermediate element comprised in the tiled electronic system of Embodiment 3, and thus a detailed description therefor is deemed unnecessary. For example, a young's modulus of the intermediate element 13 is less than a young's modulus of the plurality of electronic panels. The young's modulus of the electronic panel is defined by the young's modulus of the substrate of the electronic panel.

In the tiled electronic systems of Embodiments 1 to 3, each of the electronic units may respectively be the tiled electronic units of Embodiments 4 and 5.

Embodiment 6

Figure 7:
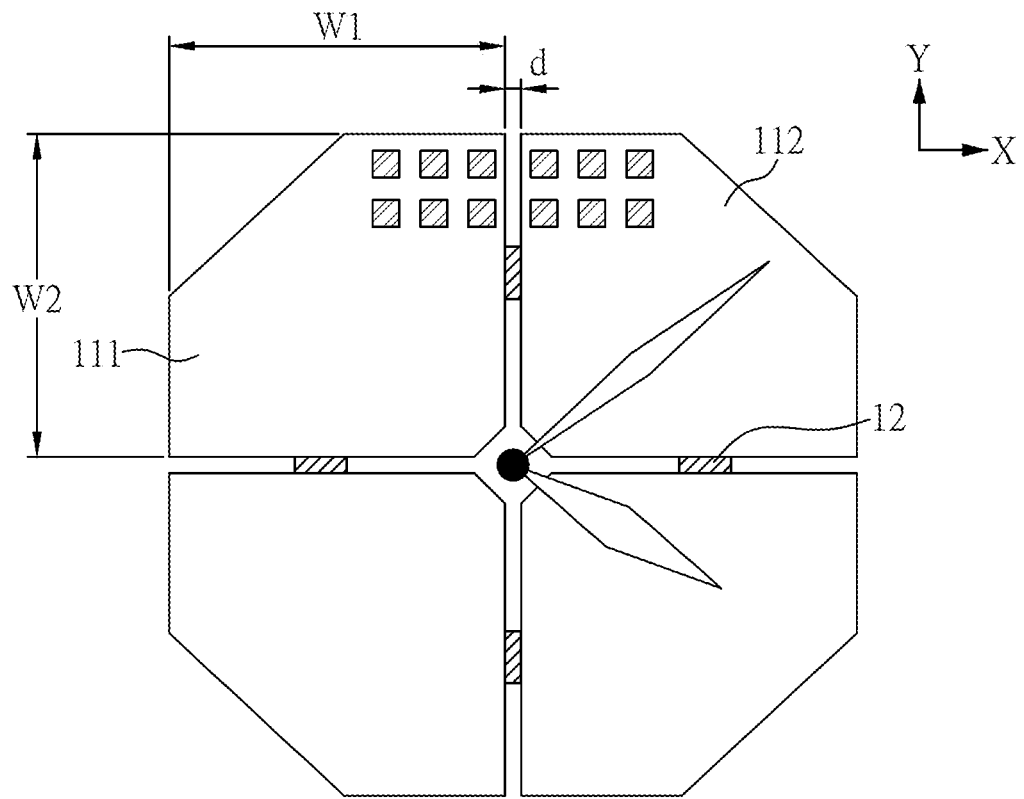
FIG. 7 is a perspective view of a tiled electronic system according to Embodiment 6 of the present disclosure.

FIG. 7 is a perspective view of a tiled electronic system according to the present embodiment. The tiled electronic system of the present embodiment is similar to that of Embodiments 1 to 3, except that the electronic units (including the first electronic unit 111 and the second electronic unit 112) are not a rectangle unit in the present embodiment.

In the present embodiment, the electronic units (including the first electronic unit 111 and the second electronic unit 112) are respectively a polygon unit, and the width W1 and the width W2 of the first electronic unit 111 respectively refers to the maximum widths of the first electronic unit 111 in the first direction X and the second direction Y perpendicular to the first direction X.

Embodiment 7

Figure 8:
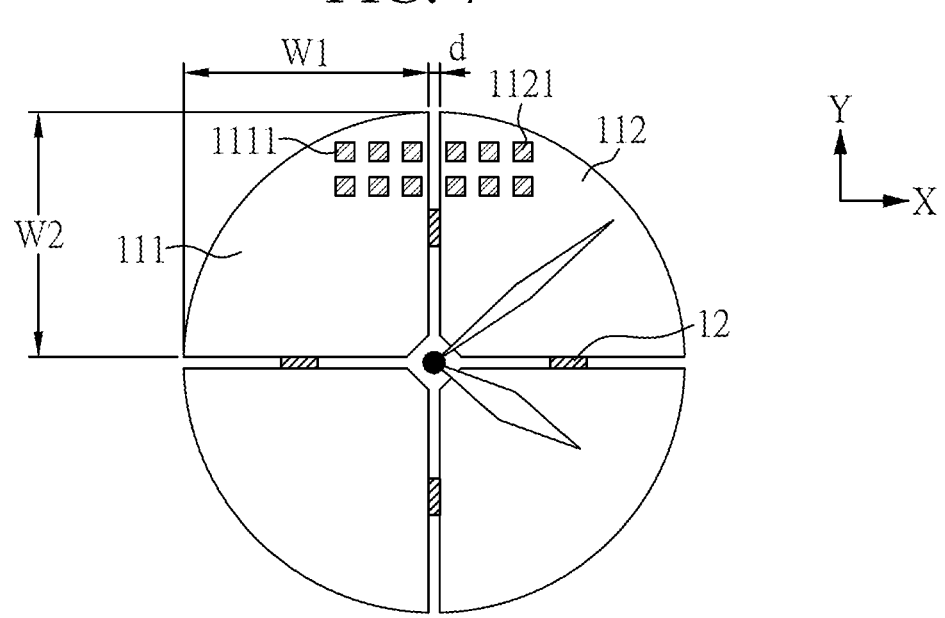
FIG. 8 is a perspective view of a tiled electronic system according to Embodiment 7 of the present disclosure.

FIG. 8 is a perspective view of a tiled electronic system according to the present embodiment. The tiled electronic system of the present embodiment is similar to that of Embodiments 1 to 3, except that the electronic units (including the first electronic unit 111 and the second electronic unit 112) are respectively a quarter circle unit in the present embodiment. In the present embodiment, the width W1 and the width W2 of the first electronic unit 111 respectively refers to the maximum widths of the first electronic unit 111 in the first direction X and the second direction Y perpendicular to the first direction X.

The tiled display system and the tiled display unit made as described in any of the embodiments of the present disclosure as described previously can be co-used with a touch panel to form a touch tiled display system or a touch tiled display unit. The tiled display unit of the present disclosure can be applied to any electronic devices that need a display screen, such as displays, mobile phones, laptops, video cameras, still cameras, music players, mobile navigators, TV sets, and other electronic devices that display images. The tiled display system of the present disclosure can be applied to any electronic devices that need to display large images, such as video walls, and advertising boards.

Although the present disclosure has been explained in relation to its embodiment, it is to be understood that many other possible modifications and variations can be made without departing from the spirit and scope of the disclosure as hereinafter claimed.

What is claimed is:

1. A tiled electronic system, comprising:
a plurality of electronic units comprising a first electronic unit and a second electronic unit, wherein the first electronic unit and the second electronic unit are arranged along a first direction the second electronic unit is separated from the first electronic unit by a distance in the first direction,
wherein the distance is conformed to the following equation (I):

$$d \geq 8.75 \times 10^{-5} \times W1 \times \sqrt{\frac{W1^2}{(W1^2 + W2^2)}} \qquad (I)$$

wherein d is the distance, W1 is a width of the first electronic unit in the first direction, and W2 is a width of the first electronic unit in a second direction perpendicular to the first direction,
wherein the first electronic unit comprises a first active element and a second active element adjacent to the first active element, the second electronic unit comprises a third active element, the first active element, the second active element and the third active element are arranged along the first direction, the second active element is disposed adjacent to a first edge of the first electronic unit, the third active element is disposed adjacent to a second edge of the second electronic unit, and the first edge is adjacent to the second edge, and wherein a first distance between the first active element and the second active element is less than a second distance between the second active element and the third active element.

2. The tiled electronic system of claim 1, wherein the distance is further conformed to the following equation (II):

$$d \geq 1.58 \times 10^{-4} \times W1 \times \sqrt{\frac{W1^2}{(W1^2 + W2^2)}} . \qquad (II)$$

3. The tiled electronic system of claim 2, wherein the distance is further conformed to the following equation (III):

$$d \geq 5.95 \times 10^{-4} \times W1 \times \sqrt{\frac{W1^2}{(W1^2 + W2^2)}} . \qquad (III)$$

4. The tiled electronic system of claim 1, further comprising an intermediate element disposed between the first electronic unit and the second electronic unit, wherein a young's modulus of the intermediate element is less than a young's modulus of the plurality of electronic units.

5. The tiled electronic system of claim 4, wherein the intermediate element comprises a light absorbing material.

6. The tiled electronic system of claim 1, wherein a difference between the first distance and the second distance is d or less.

7. The tiled electronic system of claim 1, wherein the tiled electronic system is a tiled display system, a tiled antenna system, a tiled sensing system or a combination thereof.

8. The tiled electronic system of claim 1, wherein the plurality of electronic units are arranged in juxtaposition.

9. The tiled electronic system of claim 1, wherein the plurality of electronic units are electrically connected to each other in a cascading manner.

10. A tiled electronic unit, comprising:
a driving substrate; and
a plurality of electronic panels disposed on the driving substrate and comprising a first electronic panel and a second electronic panel, wherein the first electronic panel and the second electronic panel are arranged a long a first direction, and the second electronic panel is separated from the first electronic panel by a distance in the first direction,
wherein the distance is conformed to the following equation (I):

$$d \geq 8.75 \times 10^{-5} \times W1 \times \sqrt{\frac{W1^2}{(W1^2 + W2^2)}} \qquad (I)$$

wherein d is the distance, W1 is a width of the first electronic panel in the first direction, and W2 is a width of the first electronic panel in a second direction perpendicular to the first direction, and
wherein the first electronic panel comprises a first active element and a second active element adjacent to the first active element, the second electronic panel comprises a third active element, the first active element, the second active element and the third active element are arranged along the first direction, the second active element is disposed adjacent to a first edge of the first electronic panel, the third active element is disposed adjacent to a second edge of the second electronic panel, and the first edge is adjacent to the second edge; wherein a first distance between the first active element and the second active element is less than a second distance between the second active element and the third active element.

11. The tiled electronic unit of claim 10, wherein the distance is further conformed to the following equation (II):

$$d \geq 1.58 \times 10^{-4} \times W1 \times \sqrt{\frac{W1^2}{(W1^2 + W2^2)}} . \qquad (II)$$

12. The tiled electronic unit of claim 11, wherein the distance is further conformed to the following equation (III):

$$d \geq 5.95 \times 10^{-4} \times W1 \times \sqrt{\frac{W1^2}{(W1^2 + W2^2)}} . \qquad (III)$$

13. The tiled electronic unit of claim 10, further comprising an intermediate element disposed between the first electronic panel and the second electronic panel, wherein a young's modulus of the intermediate element is less than a young's modulus of the plurality of electronic panels.

14. The tiled electronic unit of claim 13, wherein the intermediate element comprises a light absorbing material.

15. The tiled electronic unit of claim 10, wherein a difference between the first distance and the second distance is d or less.

16. The tiled electronic unit of claim 10, wherein the tiled electronic unit is a tiled display unit, a tiled antenna unit, a tiled sensing unit or a combination thereof.

17. The tiled electronic unit of claim 10, wherein the plurality of electronic panels are arranged in juxtaposition.

18. The tiled electronic unit of claim 10, wherein the plurality of electronic panels are electrically connected to the driving substrate.

* * * * *